United States Patent
Sohn

Patent Number: 5,706,001
Date of Patent: Jan. 6, 1998

[54] RUN-LENGTH DECODING APPARATUS FOR USE IN A VIDEO SIGNAL DECODING SYSTEM

[75] Inventor: Young-Seok Sohn, Seoul, Rep. of Korea

[73] Assignee: Daewoo Electronics Co., Ltd., Seoul, Rep. of Korea

[21] Appl. No.: 564,549

[22] Filed: Nov. 29, 1995

[30] Foreign Application Priority Data

Nov. 30, 1994 [KR] Rep. of Korea .................. 94-32275

[51] Int. Cl.$^6$ .................................................. H03M 7/46
[52] U.S. Cl. ............................ 341/63; 341/50; 341/67
[58] Field of Search ........................... 341/59, 50, 63, 341/65, 67

[56] References Cited

U.S. PATENT DOCUMENTS

| | | | |
|---|---|---|---|
| 4,096,527 | 6/1978 | Furuta | 358/133 |
| 4,152,697 | 5/1979 | Rider et al. | 340/347 DD |
| 4,207,599 | 6/1980 | Murayama et al. | 358/261 |
| 4,499,498 | 2/1985 | Iinuma | 358/261 |
| 4,551,706 | 11/1985 | Hunt | 340/347 DD |
| 4,590,521 | 5/1986 | Rallapalli et al. | 358/261 |
| 4,591,829 | 5/1986 | Takeda | 340/347 DD |
| 4,675,652 | 6/1987 | Machado | 340/347 DD |
| 5,359,420 | 10/1994 | Kim | 348/384 |
| 5,402,123 | 3/1995 | Jung | 341/63 |

*Primary Examiner*—Jeffrey A. Gaffin
*Assistant Examiner*—Jason L. W. Kost
*Attorney, Agent, or Firm*—Anderson Kill & Olick, P.C.

[57] ABSTRACT

A run-length decoding apparatus, for use in a video signal decoding system, for decoding a run level coded video signal to provide decoded video signal comprises an address generator, receiving the run data, for generating a write address denoting a memory location for storing the level data, a counter, responsive to a clock signal, for generating a read address for sequentially addressing the memory locations from an upper most memory location to a lower most memory location, and memory, having a number of memory locations, for storing the level data based on the write address, and for generating the decoded data stored in the memory locations based on the read addresses to thereby provide the decoded video signal.

6 Claims, 2 Drawing Sheets

RUN-LENGTH DECODING APPARATUS FOR USE IN A VIDEO SIGNAL DECODING SYSTEM

FIELD OF THE INVENTION

The present invention relates to an apparatus for decoding a digital video signal; and, more particularly, to an improved run-length decoding apparatus for use in a video signal decoding system.

DESCRIPTION OF THE PRIOR ART

As is well known, transmission of digitized video signals can attain video images of a much higher quality than the transmission of analog signals. When an image signal is expressed in a digital form, a substantial amount of data is generated for transmission, especially in the case of a high definition television(HDTV) system. Since, however, the available frequency bandwidth of a conventional transmission channel is limited, in order to transmit the substantial amounts of digital data therethrough, it is inevitable to compress or reduce the volume of the transmission data.

In a modern video image transmission or processing system, a digital video signal be coded by first obtaining the discrete cosine transform(DCT) of a block of pixels such as 8×8 blocks of pixels. The DCT coefficient data may then be zig-zag scanned, run length coded and then variable length coded using, for example, a Huffman code. The DCT, which reduces or makes use of spatial redundancies between image data, converts a block of digital image data, for example, a block of 8×8 pixels, into a set of transform coefficient data.

In the run-length coding(RLC) technique, the zig-zag scanned transform coefficient data block is converted into a plurality of combinations, each of the combinations including a run-length and a corresponding level, wherein the run-length represents the number of continuous zeroes preceding a non-zero transform coefficient data and the level indicates the amplitude of the non-zero transform coefficient data following the continuous zeroes.

The variable length coding(VLC), which is one of the widely known techniques for achieving a bit rate reduction, converts fixed-length data to variable-length codewords based on the statistical occurrences of the data. The length of the codewords is chosen in such a manner that shorter codewords are used to represent more frequently occurring data and longer codewords are selected to represent less frequently occurring data.

A decoder for decoding a digital video signal coded in the afore-described manner includes a variable length decoder (VLD), a run-length decoder(RLD), and a processor employing the inverse DCT.

In the decoder, inputted to the VLD are the variable length codewords and outputted from the VLD are fixed length codewords which contain two pieces of information: a run-length of continuous zeroes and the amplitude of non-zero DCT transform coefficient data. The RLD receives the fixed length codewords and generates a stream of zig-zag scanned transform coefficient data.

In general, there are two basic VLD structures to decode the variable length coded bit stream: one is a sequential VLD and the other is a parallel VLD.

The parallel VLD divides the variable length coded bit stream into a number of bit segments and then simultaneously decodes the divided bit segments. Therefore, the parallel VLD may perform a high speed data processing. However, the parallel VLD is hardly used in a digital video signal decoding system because the hardware structure thereof is tends to be very complicated. On the other hand, the sequential VLD, which sequentially decodes the variable length coded bit stream from the beginning, is generally used in a digital video signal decoding system for the simplicity of the hardware structure thereof.

In the sequential VLD, since each of the codewords in the variable length coded bit stream has a different length, if the input rate of the variable length coded bit stream is made constant, the decoded symbols are outputted at a variable rate, and if the output rate is constrained to have the symbols be outputted at a constant rate, the input rate has to be made variable. Accordingly, a buffer to compensate for the difference in the processing rate of codewords has to be incorporated in the RLD connected to the VLD. However, the interface circuit needed to control the buffer becomes highly complicated, thereby increasing the hardware complexity of the system.

SUMMARY OF THE INVENTION

It is, therefore, a primary object of the invention to provide a run-length decoding apparatus having a reduced hardware complexity, without having to use a buffer requiring a complex interface circuit.

In accordance with the present invention, a run-length decoding apparatus, for use in a video signal decoding system, for decoding a run level coded video signal to provide a decoded video signal, wherein the run level coded video signal divided into a plurality of blocks, each block having a multiplicity of run-level pairs and each pair having run data and level data, which comprises: an address generator, receiving the run data, for generating a write address denoting a memory location for storing the level data; a counter, responsive to a clock signal, for generating a read address for sequentially addressing the memory location from an upper most memory location to a lower most memory location; means for generating the clock signal; and memory, having a number of memory locations, for storing the level data based on the write address, and for generating the decoded data stored in the memory locations based on the read addresses to thereby provide the decoded video signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Figure 1:
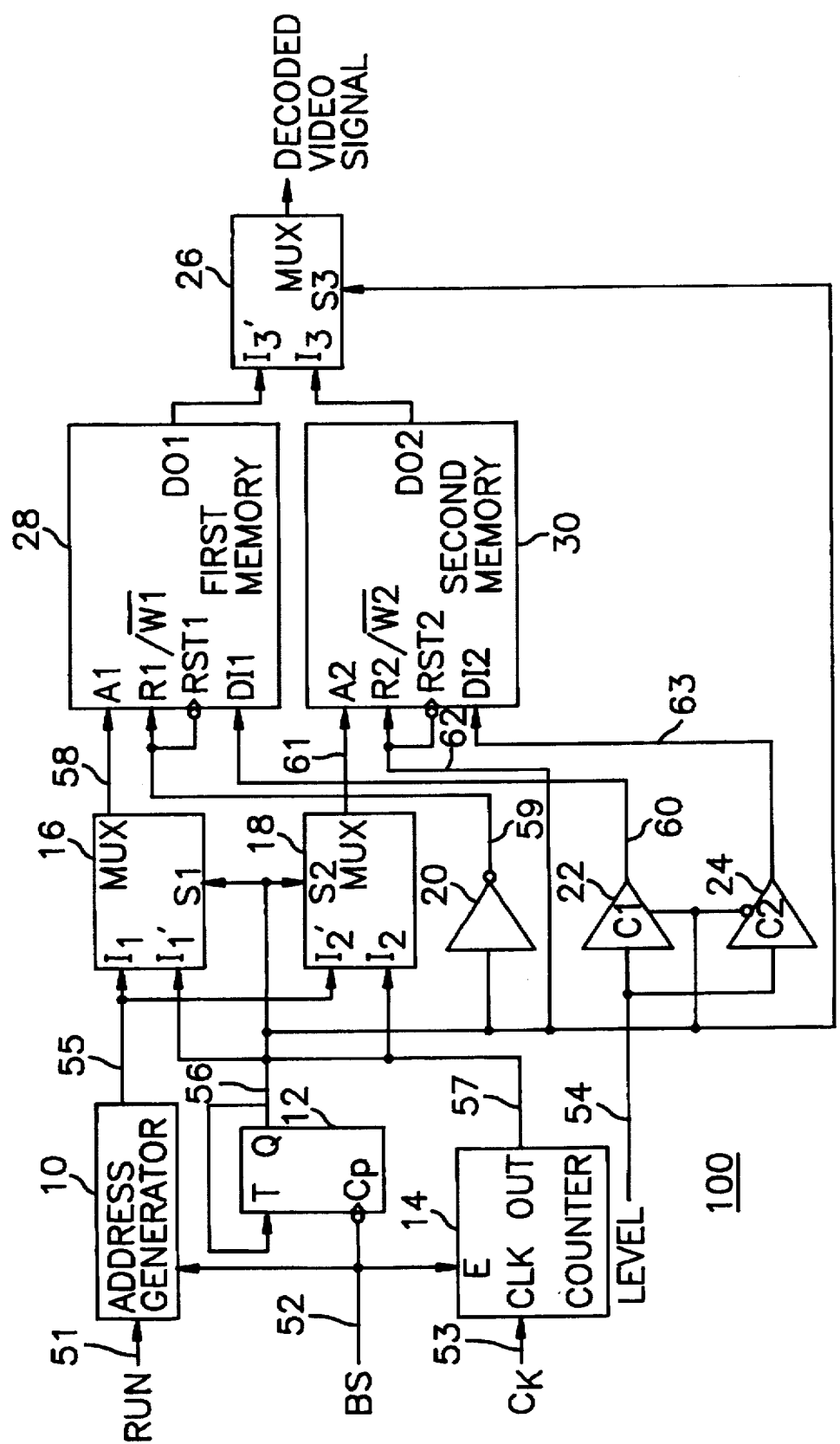
FIG. 1 shows a schematic diagram of a run-length decoding apparatus in accordance with the present invention.

A run-length decoding apparatus in accordance with a preferred embodiment of the present invention is shown in FIG. 1. The run-length decoding apparatus 100 decodes a run level coded video signal to provide a decoded video signal, wherein the run level coded video signal is divided into a plurality of blocks, each block having a multiplicity of run-level pairs and each pair having run data and level data. The run data represents the number of continuous zeroes preceding a non-zero value and the level data indicates the amplitude of the non-zero value following the continuous zeroes.

As shown in FIG. 1, run data RUN, level data LEVEL corresponding to the run data, and a block start signal BS representing the start of a block are simultaneously provided from a variable length decoder(VLD)(not shown) onto respective leads 51, 54 and 52. The RUN on the lead 51 is inputted in an address generator 10 which also receives the BS on the lead 52 as a clear signal. The address generator 10 adds RUN to the previous write address stored therein, and generates an M-bit, e.g., 6-bit, write address to an input terminal $I_1$ of a first multiplexer(MUX) 16 and an input terminal $I_2'$ of a second MUX 18, the write address denoting a memory location for storing the level data. The previous write address becomes 0 when the clear signal, i.e., BS is a logic high.

The counter 14 which receives the BS as a count enable signal serves to generate read addresses for sequentially addressing memory locations from the upper most memory location to the lower most memory location in response to clock signals applied thereto.

Specifically, the counter 14 is enabled by the BS with a logic high applied to a terminal E thereof via the lead 52. The counter 14, which may employ an M-bit, e.g., 6-bit, counter well known in the art, loads zero as an initial count in response to the count enable signal with the logic high, and increments the initial count by 1 and simultaneously outputs at its output terminal OUT the incremented count on a lead 57 as a read address, each time the clock pulse $C_k$ on a lead 53 is applied to a terminal CLK thereof, wherein the $C_k$ has a duration time equal to $½^M$, i.e., ¹⁄₆₄, of the BS duration time. The incremented count on the lead 57 is coupled to input terminals $I_1'$ and $I_2$ of the first and the second MUXs 16 and 18, respectively.

A flip-flop circuit 12, in response to the block start signal BS also applied thereto, generates first and second selection signals on a lead 56 as its output signal, the first and the second selection signals having a logic high and a logic low levels, respectively.

In the preferred embodiment of the invention, a T flip-flop which includes an input terminal T connected to its output terminal Q may be employed as the flip-flop circuit 12, wherein the output state of the T flip-flop is complemented when the BS is applied to a terminal $C_p$ thereof. More specifically, the output state of the T flip-flop 12 is toggled at every falling edge of the BS.

The output signal of the T flip-flop 12, i.e., the first and the second selection signals on the lead 56 are coupled to terminals S1, S2 and S3 of the first and the second MUXs 16 and 18 and a third MUX 26, to terminals R2/W2 and RST2 of the second memory 30, and terminals R1/W1 and RST1 of the first memory 28 though an inverter 20. The inverter 20 serves to invert the first and second selection signals, and simultaneously provide the inverted first and second selection signals to terminals R1/W1 and RST1 of the first memory 28. Specifically, if the first selection signal, i.e., a logic high, is applied to the terminals S1 and S2, the first MUX 16 provides the write address applied from the address generator 10 through the input terminal $I_1$ thereof to a terminal A1 of the first memory 28 over a lead 58, and the second MUX 18 provides the read addresses applied from the counter 14 through the input terminal $I_2$ thereof to a terminal A2 of the second memory 30 over a lead 61. If the second selection signal, i.e., a logic low, is applied to the terminals S1 and S2, the first MUX 16 provides the read addresses applied from the counter 14 through the input terminal $I_1'$ to the A1 over the lead 58, and the second MUX 18 provides the write address applied from the address generator 10 through the input terminal $I_2'$ to A2 over the lead 61.

In the meantime, the level data LEVEL on the lead 54 is simultaneously provided to first and second three-state gates 22 and 24, which includes a control input terminal C1 and an inverted control input terminal C2, respectively, the C1 and C2 receiving as their respective control signal the first and the second selection signal on the lead 56. If the control signal applied to C1 and C2 is a logic high, the first three-state gate 22 transfers the LEVEL applied thereto to a data input terminal DI1 of the first memory 28 over a lead 60, while the second three-state gate 24 gives a high impedance state without data transmission thereof; otherwise, the second three-state gate 24 transfers the LEVEL applied thereto to a data input terminal DI2 of the second memory 30 over a lead 63, while the first three-state gate 22 gives the high impedance state.

In accordance with the invention, the first and second memories 28 and 30 are of a random access memory(RAM), each of which includes P memory locations, P being equal to $2^M$, e.g., 64. The first memory 28 is write and read enabled in response to the inverted first and second selection signals on the lead 59, respectively, and is reset(i.e., zeroes are stored in all of the memory locations thereof) for each transition from the inverted second selection signal to the inverted first selection signal; and the second memory 30 is write and read enabled in response to the second and first selection signals on the lead 62, respectively, and is reset for each transition from the first selection signal to the second selection signal.

Specifically, the first memory 28 is write enabled in response to the inverted first selection signal from the inverter 20 and stores the LEVEL applied to DI1 in the memory location indicated by the write address applied to A1; and the second memory 30 is simultaneously read enabled in response to the first selection signal from the T flip-flop 12 and generates the decoded data stored in the memory locations thereof based on the read addresses for sequentially addressing the memory locations from the upper most memory location to the lower most memory location applied to A2 to an input terminal $I_3$ of the third MUX 26 as the decoded video signal and is then reset for each transition from the first selection signal to the second selection signal. Thereafter, the first memory 28 is read enabled in response to the inverted second selection signal and generates the data stored in the memory locations thereof based on the read addresses applied to A1 to an input terminal $I_3'$ of the MUX 26 as the decoded video signal and is then reset for each of the transition from the inverted second selection signal to the inverted first selection signal; and the second memory 30 is simultaneously write enabled in response to the second selection signal and stores the LEVEL applied to the DI2 in the memory location indicated by the write address applied to A2. The third MUX 26 selects the decoded video signal applied from the second memory 30 through the terminal $I_3$ in response to the first selection signal, and selects the decoded video signal applied from the first memory 28 through the terminal $I_3'$ in response to the second selection signal.

Figure 2:
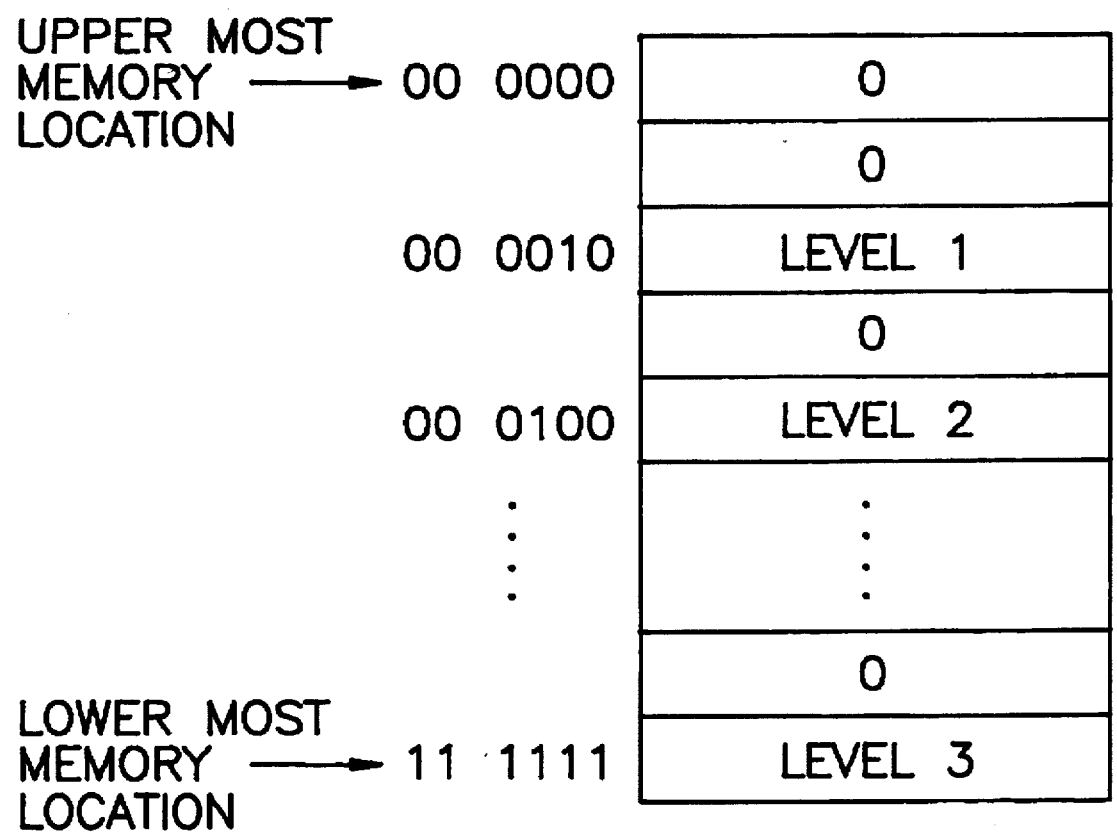
FIG. 2 depicts an exemplary memory employed as the first and second memories shown in FIG. 1.

FIG. 2 illustrates an exemplary memory employed as the first and second memories 28 and 30 shown in FIG. 1, wherein the memory includes 64 memory locations from upper most memory location to lower most memory location, the addresses of the upper most and lower most memory locations being binary numbers "00 0000" and "11 1111", respectively. Each of the level data is stored in each memory location indicated by the write address. For example, LEVEL 1, LEVEL 2 and LEVEL 3 are stored in the memory locations indicated by the write addresses "00 0010", "00 0100" and "11 1111", respectively.

As may be seen from the above, it should be readily appreciated that the run-length decoding apparatus of the present invention is capable of decoding the run level coded video signal without having to use a buffer memory requiring a complex interface circuit, thereby reducing the hardware complexity of the system.

While the present invention has been shown and described in connection with the preferred embodiments only, it will be readily apparent to those of ordinary skill in the art that many changes and modifications may be made without departing from the spirit and scope of the invention as defined in the appended claims.

What is claimed is:

1. A run-length decoding apparatus, for use in a video signal decoding system, for decoding a run level coded video signal to provide a decoded video signal, wherein the run level coded video signal is divided into a plurality of blocks, each block having a multiplicity of run-level pairs and each pair having run data and level data, which comprises:

means, receiving the run data, for generating a write address denoting a memory location for storing the level data;

means, responsive to a clock signal, for generating a read address for sequentially addressing the memory location from an upper most memory location to a lower most memory location;

means for generating the clock signal; and first memory means, having a number of memory locations, for storing the level data based on the write address, and for generating the decoded data stored in the memory locations based on the read addresses to thereby provide the decoded video signal.

2. The apparatus according to claim it further comprising second memory means having the number of memory locations for storing the level data based on the write address, and for generating the decoded data stored in the memory locations based on the read addresses to thereby provide the decoded video signal, and coupling means, in response to a block start signal representing the start of a block, for alternately relaying the write address or read addresses to the first or the second memory means.

3. The apparatus according to claim 2, wherein the coupling means includes:

means for generating first and second selection signals in response to the block start signal, the first selection signal having a logic high level and the second selection signal having a logic low level;

first selection means for providing the write address in response to the first selection signal, and providing the read addresses in response to the second selection signal;

second selection means for providing the read addresses in response to the first selection signal and providing the write address in response to the second selection signal;

means for inverting the first and the second selection signals and simultaneously providing the inverted first and second selection signals to the first memory means;

means for providing the level data to the first memory means in response to the first selection signal, and for providing the level data to the second memory means in response to the second selection signal; and output selection means for selecting the decoded video signal from the first memory means in response to the first selection signal, and selecting the decoded video signal from the second memory means in response to the second selection signal.

4. The apparatus according to claim 3, wherein the selection signal generating means is a T flip-flop including an input terminal connected to its output terminal, the output state of the T flip-flop being complemented at every falling edge of the block start signal.

5. The apparatus according to claim 3, wherein the level data providing means includes:

first three-state gate for providing the level data applied thereto to the first memory means in response to the first selection signal; and second three-state gate for providing the level data applied thereto to the second memory means in response to the second selection signal.

6. The apparatus according to claim 3, wherein the first and second memory means are random access memories, each of which includes the number of memory locations, wherein the first memory means is write and read enabled in response to the inverted first and second selection signals, respectively, and is reset for each transition from the inverted second selection signal to the inverted first selection signal, and the second memory means is write and read enabled in response to the second and first selection signals, respectively, and is reset for each transition from the first selection signal to the second selection signal.

* * * * *